United States Patent [19]

Yamamoto et al.

[11] Patent Number: 4,790,407

[45] Date of Patent: Dec. 13, 1988

[54] RESONANCE-COMPENSATED SPEAKER SYSTEM FOR VEHICLE

[75] Inventors: Hideo Yamamoto; Kazunori Takagi, both of Saitama, Japan

[73] Assignee: Pioneer Electronic Corporation, Tokyo, Japan

[21] Appl. No.: 900,923

[22] Filed: Aug. 27, 1986

[30] Foreign Application Priority Data

Aug. 29, 1985 [JP] Japan .......................... 60-130839[U]

[51] Int. Cl.[4] ............................................. H05K 5/00

[52] U.S. Cl. .................................... 181/141; 181/156; 181/160; 381/86; 381/159

[58] Field of Search ............... 181/141, 150, 155, 156, 181/160; 381/86, 159

[56] References Cited

U.S. PATENT DOCUMENTS

| | | | |
|---|---|---|---|
| 2,186,276 | 1/1940 | Schwartz et al. | 181/150 |
| 2,491,982 | 12/1949 | Kincart | 181/156 |
| 3,276,538 | 10/1966 | Guyton et al. | 181/141 |
| 3,826,333 | 7/1974 | Buckwalter | 181/156 X |
| 4,135,600 | 1/1979 | Ogi et al. | 181/156 |
| 4,144,416 | 3/1979 | Bubb | 181/150 X |
| 4,168,761 | 9/1979 | Pappanikolaou | 181/156 |
| 4,230,905 | 10/1980 | Crum et al. | 181/155 |
| 4,572,326 | 7/1986 | Hutchins | 181/150 |
| 4,618,025 | 10/1986 | Sherman | 181/156 X |

*Primary Examiner*—Benjamin R. Fuller
*Attorney, Agent, or Firm*—Sughrue, Mion, Zinn, Macpeak, and Seas

[57] ABSTRACT

A vehicular speaker system in which a resonance of the vehicle's interior is compensated by a resonance of a chamber enclosing the rear of the speaker unit. The chamber includes rearwardly facing ports.

8 Claims, 5 Drawing Sheets

RESONANCE-COMPENSATED SPEAKER SYSTEM FOR VEHICLE

BACKGROUND OF THE INVENTION

1. Field of the Invention

This invention relates to a speaker system to be installed in the passenger compartment of a vehicle and more particularly to the installation of a speaker unit in the door, beneath the rear tray or in the dashboard of a vehicle such as an automobile.

2. Background Art

FIG. 1 shows a speaker unit 1 of a conventional speaker system installed in a door 2 of a passenger-carrying vehicle. FIG. 2 shows another speaker system wherein the speaker unit 1 is enclosed with a waterproof cover 4 beneath a side-window glass 3. FIG. 3 shows still another speaker unit 1 of a speaker system installed in a trunk 7 beneath a rear tray 5 and behind a rear seat 8. The speaker unit faces a rear window glass 6. A description will subsequently be given of the installation of a speaker system in the above cases.

The speaker unit 1 of the conventional speaker systems has its rear surface opened into the door 2 or the trunk 7 or possibly the waterproof cover 4 forming an airtight chamber.

Even though the speaker unit 1 of the conventional vehicular speaker system has a flat frequency response, the sound pressure level has peaks respectively in the neighborhoods of 250 Hz and 1 kHz as shown in FIG. 4 from the effect of standing and reflected waves inside the vehicle. Furthermore, there is a dip in the neighborhood of 600 Hz. Thus the installed speaker system exhibits steeply peaking and dipping characteristics.

Furthermore, a dip appears in the vicinity of 800 Hz and a peak appears in the vicinity of 1 kHz if the speaker unit 1 is provided with the waterproof cover 4 as shown in FIG. 2. When the frequency response of the speaker unit 1 is combined with those inside the vehicle, the sound pressure level will show characteristics that are further steeply peaked and dipped.

SUMMARY OF THE INVENTION

The present invention is intended to eliminate the above drawbacks of the conventional speaker system to be installed in a vehicle. Therefore an object of the invention is to provide a speaker system to be installed in a vehicle which has a flat frequency response by applying opposing characteristics to the above-described peaking and dipping and synthesizing the resulting frequency characteristics with those inside the vehicle.

In order to accomplish the above object, according to the present invention, a tubular back chamber, having ports in the form of slits disigned to produce a resonance frequency at 300–600 Hz, is attached to the rear surface of the speaker unit.

DETAILED DESCRIPTION OF THE PREFERRED EMBODIMENTS

Referring now to FIGS. 5–8, an embodiment of the present invention will be described.

Figure 1:
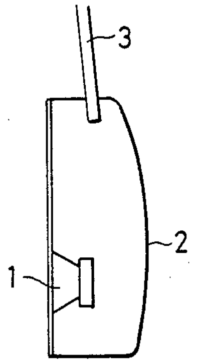
FIG. 1 PRIOR ART
FIGS. 1–3 are sectional views of a speaker system to be installed in a vehicle in a conventional manner.
Figure 2:
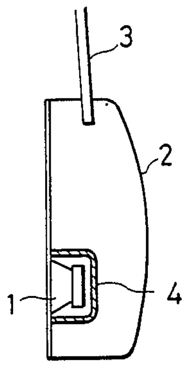
FIG. 2 PRIOR ART
Figure 3:
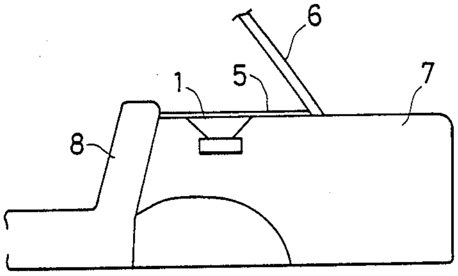
FIG. 3 PRIOR ART
Figure 4:
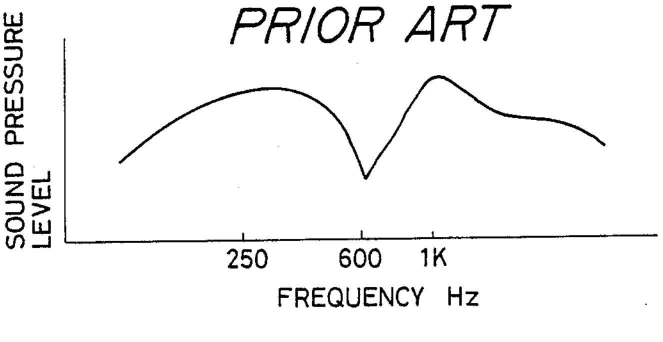
FIG. 4 PRIOR ART
FIG. 4 shows typical characteristics of the systems of FIGS. 1–3 inside the vehicle.
Figure 5:
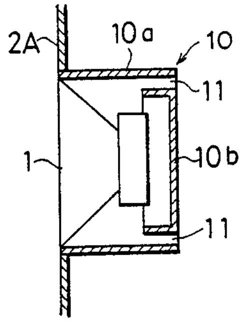
FIG. 5 is a sectional view of an embodiment of the present invention.

In FIG. 5, there is shown an arrangement of a speaker unit 1 affixed to a door panel 2A. A back chamber 10 is fitted to the door panel 2A and covers the rear surface of the speaker unit 1. Ports 11 in the form of a slit are made on the outer periphery of the rear end of the back chamber 10.

Figure 6:
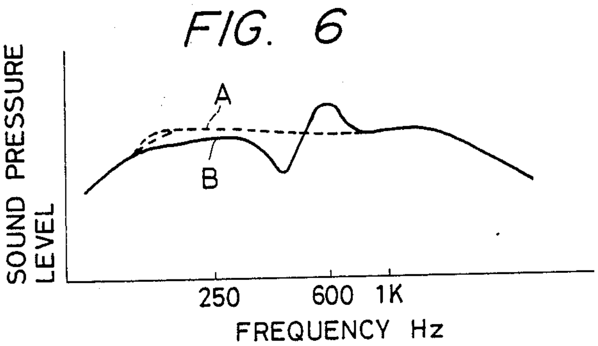
FIG. 6 is a frequency characteristic chart.

The ports 11 allow the generating of resonance relative to the vibration of the diaphragm of the speaker unit 1 and act as a sort of bass-relax enclosure, so that the speaker unit 1 having a flat frequency response A in an anechoic room shows a frequency response B of FIG. 6.

Figure 7:
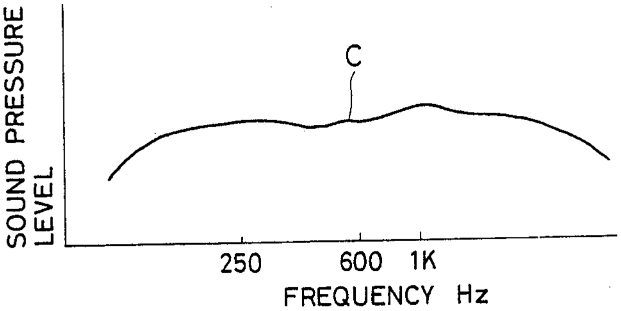
FIG. 7 is a frequency characteristic chart of a speaker unit installed in a vehicle.

If the peak of the frequency response is synthesized to have a frequency equal to the dip frequency of 600 Hz of the characteristics inside the vehicle, the dip will be cpompensated and a flat frequency response C will be obtained as the synthesized characteristics inside the vehicle, as shown in FIG. 7.

In order to set the peak frequency in the vicinity of 600 Hz, the port resonance frequency should be set at 300–600 Hz to cause the sound pressure derived from the speaker unit 1 to dip below the set resonance frequency and to peak in the vicinity of 600 Hz, which is higher than the set resonance.

Mathematically, the port resonance frequency $f_P$ is given by $$fp = Dp \cdot C/(4\sqrt{V_c(\pi Lp + 8Dp/3)})$$

where $V_c$ is the volume of the enclosure, $D_P$ is the port diameter, $L_P$ is the port length and C is the acoustic velocity.

When the frequency is lower than the set resonance frequency, the ports constitute acoustic resistance, thus causing the sound pressure to drop.

Figure 8:
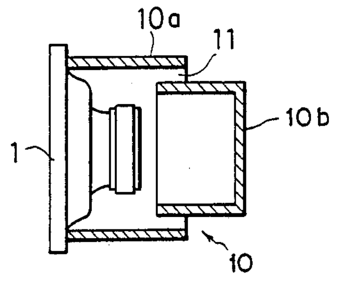
FIG. 8 is a sectional view of the speaker unit having the frequency characteristics of FIG. 7.
Figure 9:
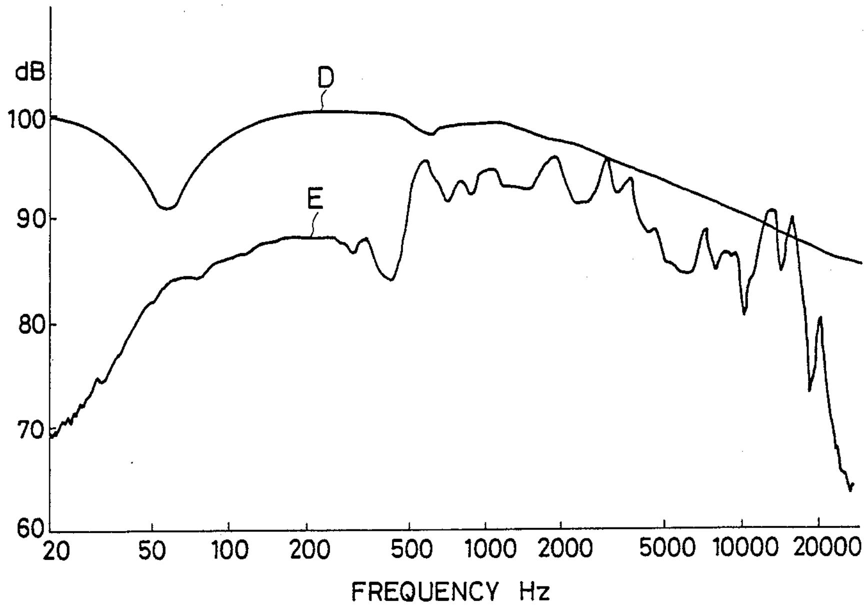
FIG. 9 is a frequency characteristic chart in an anechoic room.

FIGS. 8 and 9 show an experimental example of this embodiment, wherein admittance response D and frequency response E shown in FIG. 9 were obtained in an anechoic room under the following conditions. The back chamber 10 had an internal volume of 0.5 liter. The ports 11 were each of 2.45 cm in radius and 1 cm long with a calculated resonance of 468 Hz. These components were added to a full-range speaker unit 1 having a diameter of 16 cm and showing a flat characteristic in the anechoic room.

Although a tubular back chamber 10*a* was used according to this embodiment, its functions will not change even if a polygonal back chamber 10 is employed.

Figure 10:
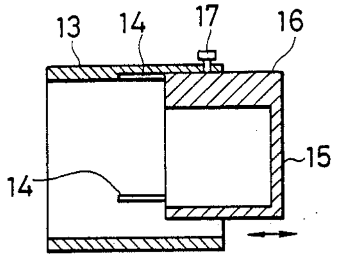
FIGS. 10 and 11 are a sectional view and a rear view of another embodiment of the present invention.
Figure 11:
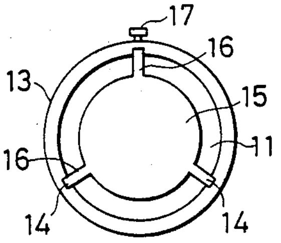

The fixed type back chamber 10 and ports 11 are shown in the above embodiment. However, the internal space of the back chamber 10 and the length of the ports 11 may be variable, as shown in FIGS. 10 and 11.

More particularly, a plurality of guide grooves 14 are formed in the axial direction of an external tube, or first tubular part, 13 and a plurality of support vanes 16 project from a closed-end internal tube, or second tubular part, 15 and are slidably inserted into the guide grooves 14.

After the ports 11 and the internal tube 15 are set to have the desired length and chamber volume by sliding the support vanes 16 along the external tube 13, the support vanes 16 are fixed with bolts 17.

Accordingly, it becomes possible to deal with the different dip frequencies inside the vehicle depending on the interior configuration of the vehicle and the locations of the speaker unit by adjusting the dip frequency inside the vehicle.

Figure 12:
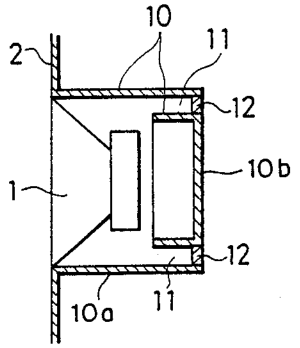
FIG. 12 is a sectional view of still another embodiment of the present invention.

Although the resonance frequency has been completely determined by the volume of the back chamber 10 and the length of the ports 11 according to the above embodiments, the ports 11 may be loaded with acoustically resistant porous material 12, such as foamed urethane and cloth, as is shown for another embodiment in FIG. 12.

Figure 13:
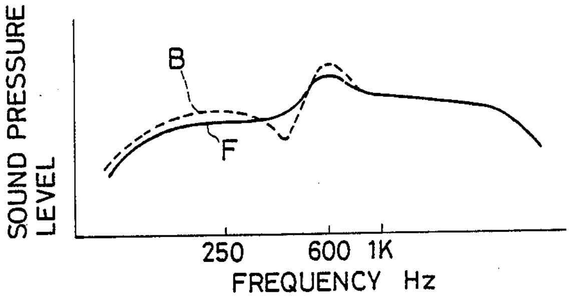
FIG. 13 is a frequency characteristic chart of the embodiment of FIG. 12.

The air flowing through the ports 11 is caused to have resistance by the acoustically resistant material 12 and the peaking and dipping amplitude and the low sound pressure level can be altered. In other words, the peaking and dipping amplitude of the frequency response B of FIG. 6 is adjsted to a frequency response F of FIG. 13 depending on the amplitude of the dip of the characteristics inside the vehicle, so that delicate sound adjustment becomes possible.

Figure 14:
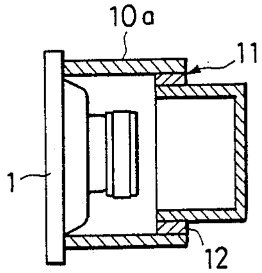
FIG. 14 is a sectional view of an even further embodiment of the present invention.
Figure 15:
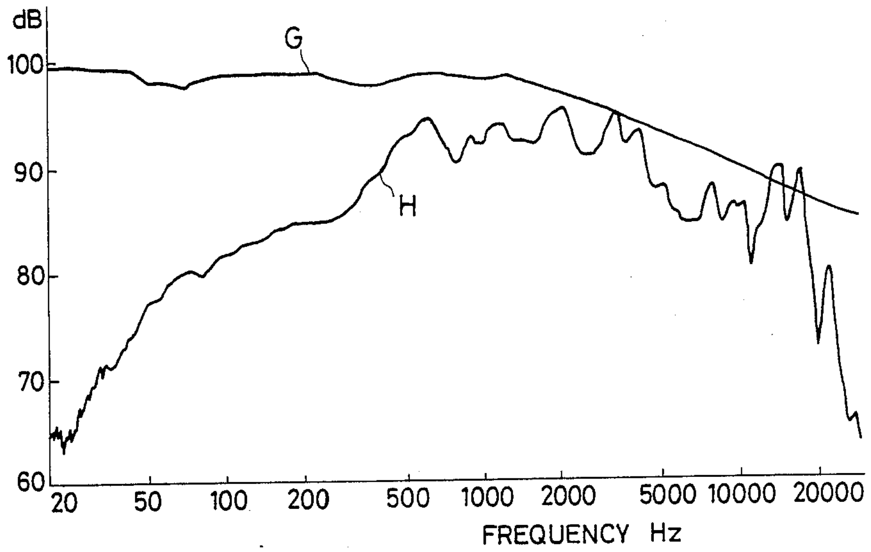
FIG. 15 is a frequency characteristic chart of the embodiment of FIG. 14.

FIGS. 14 and 15 show an experimental example of the last embodiment, wherein the ports 11 of the speaker unit of FIG. 14 are loaded with foamed urethane 12 over its whole length, as shown in FIG. 14. The resultant admittance response G and frequency response H are shown in FIG. 15.

As set forth above, the frequency response peaks since the back chamber and the ports for setting the resonance frequency at 300–600 Hz are installed on the rear surface of the speaker unit.

In consequence, the 300–600 Hz dip characteristic produced inside the vehicle is compensated when the speaker unit according to the present invention is installed and the flat frequency response thus obtained ensures pleasant music listening within the vehicle.

Since the back chamber acts as a waterproof cover when the speaker unit is installed in the door, no waterproof cover becomes necessary and a dip in the vicinity of 800 Hz as well as a peak in the vicinity of 1 kHz is thereby prevented.

The ports of the back chamber are provided on the outer periphery of the rear end thereof. Thereby the installation of the door is facilitated because its whole thickness can be reduced.

There is no necessity for using a graphic equalizer for flattening the frequency response, thus making available an inexpensive speaker system for vehicle installation. The invention has the effect of permitting a speaker system offering excellent frequency response to be installed in any of the existing vehicle.

We claim:

1. A vehicular speaker system for use in a movable vehicle having a substantially closed interior passenger compartment comprising;

a speaker assembly adapted to be installed in said vehicle for projecting sound into said compartment, wherein said speaker assembly comprises:

a speaker unit;

an axially extending chamber having a peripheral portion and an end portion respectively enclosing lateral sides and a rear side of said speaker unit;

wherein said chamber includes ports formed between said peripheral portion and said end portion and wherein said chamber has a resonance frequency in a range of 300–600 Hz.

2. A vehicular speaker system as recited in claim 1, wherein said chamber is axially tubular.

3. A vehicular speaker system as recited in claim 1, wherein said chamber is axially polygonal.

4. A vehicular speaker system as recited in claim 2, wherein a peak resonance frequency of said chamber with said ports is matched with a minimum resonance frequency of said interior passenger compartment of said vehicle.

5. A vehicular speaker system as recited in claim 2, wherein said peripheral portion surrounding said lateral sides of said speaker unit has an inner diameter of a first dimension, and said end portion has an outer diameter of a second dimension smaller than the first dimension, said end portion covering the rear side of said speaker unit and extending rearwardly further than said peripheral portion, wherein said ports are formed between said peripheral portion and said end portion.

6. A vehicular speaker system as recited in claim 2, wherein said chamber includes a first tubular part surrounding said lateral sides of said speaker unit and said end portion having a second tubular part, and further comprising axially slidable means secured partially within said peripheral portion for adjusting the end portion toward and away from the speaker unit and wherein said ports are formed between said peripheral portion and said end portion.

7. A vehicular speaker system as recited in claim 1, wherein said ports are at least partially filled with a porous, acoustically damping material.

8. A vehicular speaker system as recited in claim 7, wherein said acoustically damping material comprises foamed urethane.

* * * * *